Aug. 4, 1964 R. G. OLIN ETAL 3,143,484

METHOD OF MAKING PLATED CIRCUIT BOARDS

Filed Dec. 29, 1959

Inventor:
Raymond G. Olin,
Ralph W. Richter,
by Norman C. Fulmer
His Attorney.

3,143,484

METHOD OF MAKING PLATED CIRCUIT BOARDS

Raymond G. Olin, Utica, and Ralph W. Richter, Whitesboro, N.Y., assignors to General Electric Company, a corporation of New York Filed Dec. 29, 1959, Ser. No. 862,569
8 Claims. (Cl. 204—15)

This inventioin relates to plated circuit boards, sometimes called printed circuit boards, having electrical circuit conductors attached to the surface of a board made of a material that is an electrical insulator. More particularly, the invention relates to a new and improved method for making plated circuit boards. Plated, or printed, circuit boards are useful in radio receivers, in television receivers, and in other electrical devices.

Various schemes have been devised, in the prior art, for making plated or printed circuit boards. For example, circuit conductors in the form of metallic foil have been cemented or otherwise attached to the board. Also, metallic powders have been printed onto the board in a desired pattern. A previously known method of producing a plated circuit board comprises the steps of applying a metallic base coat over the entire surface of the board, applying a resist material over the metallic base coat wherever there is to be no conductor, electroplating whereby copper is applied to the base coat wherever the printed conductors are desired, and then removing the resist and the base coat that was underneath the resist, In such a method of plating a circuit, the step of removing the resist and the base coat is difficult to perform, and is apt to cause contamination of, or chemical or mechanical injury to, the plate circuit.

An object of this invention is to provide an improved method for producing a plated circuit board, wherein there is no need for the removal of any material or coating from the circuit side of the board.

Another object is to provide an improved method for producing a plated circuit board, wherein there is substantially no risk of contaminating or otherwise injurying the plated circuit.

Other objects are to provide a method of producing a plated circuit board which is less costly than previously known methods, and which results in a network of plated conductors that are firmly attached to the board. Other objects will be apparent from the following disclosure and from the claims, and from the drawing in which:

Figure 3:
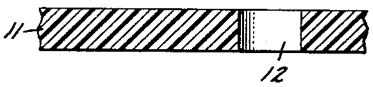
FIG. 3 is a cross-sectional view of FIG. 1 taken on the line 3—3 thereof.

The invention comprises, essentially, a method for making a plated circuit board, comprising the steps of providing one or more holes through the board at each area where a plated conductor is desired, applying a resist to one side (the front or circuit side) of the board in a pattern so as to cover all areas except where the plated circuitry is desired, electroless-plating the board with copper or other suitable conductive material thereby to plate the portions of the board which are not covered by the resist, thereafter applying a resist to the back surface of the board, electroplating the board by making an electrical connection to the electroless-plating on the back surface of the board whereby electrical contact is made through the electroless-plated holes to the electroless-plated circuit portions of the front surface of the board, thereby plating copper or other conductive material over the electroless-plated regions of the board where plated conductors are desired, and thereafter removing the resist and electroless-plating from the backside of the board.

Now referring to the drawing, a board 11, preferably of flat shape and made from electrically insulating material such as paperphenolic laminate or an epoxy or other suitable material, is provided with one or more holes 12 therethrough at each area where a plated conductor is desired, these holes 12 being located at positions where it will be desired to have terminal wires of electrical components passed therethrough and soldered to the plated conductors. Preferably, but not necessarily, the surfaces of the board 11 are roughened, as by sand blasting, so as to facilitate the subsequent electroless plating of the board. The board 11 can, if desired, be curved or bent, or it may be in the shape of a hollow cylinder.

In order to facilitate the subsequent step of electroless plating, it may be desirable to prepare the board 11 by placing it in a sensitizing bath and then in a seeding bath. The sensitizing bath may comprise a solution of:

5 grams of stannous chloride ($SnCl_2$)
25 cubic centimeters of hydrochloric acid (HCl), and
500 cubic centimeters of water.

The board is placed in the sensitizing bath for approximately fifteen second, and then is placed in a seeding bath, also for approximately fifteen second, comprising a solution of:

10 grams of silver nitrate ($AgNO_3$) and
500 cubic centimeters of water.

These preferred compositions of the sensitizing and seeding baths are given by way of example, and other solutions are also suitable for use is preparing the board for the step of electroless plating.

Figure 4:
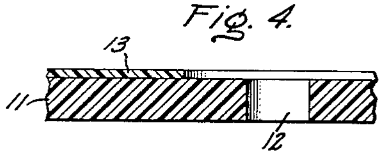
FIGS. 4 through 8 are cross-sectional views of the board showing its appearance at different stages of the plating method in accordance with the invention.
Figure 2:
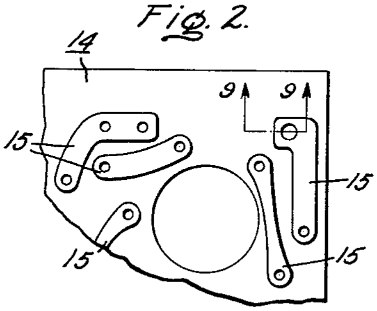
FIG. 2 is a front view of the same portion of a board after a desired circuit has been plated thereon.

As the next step, a coating 13 of plating resist material is applied to the front surface of the board wherever it is desired not to have a plated conductor in the final product (see FIG. 4). The overall regions of the board that are covered by the resist 13 are indicated generally by the numeral 14 in FIG. 2, and areas to be covered with electrically conductive material in the final product, are indicated by the numerals 15 in FIG. 2. The plating resist should be a material which will withstand both alkali and acid. Such materials are well known. By way of example, some suitable well known plating resist materials are polyester resins, epoxy resins, melamine plastic, and certain silicone resins. The plating resist 13 may be applied to the surface of the board 11 in the desired areas by means of a silk screen process, or the resist can be printed onto the surface of the board 11.

Next, the board is electroless plated by placing it in a suitable electroless-plating bath. A suitable electroless-plating bath comprises a solution of:

8 milliliters per liter of formaldehyde,
25 grams per liter of sodium hydroxide,
11 grams per liter of copper sulphate, and
10 grams per liter of cream of tartar.

Figure 5:
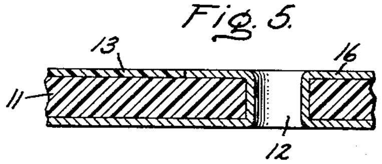

The board is placed in the electroless-plating bath for approximately forty-five minutes or until the copper plating builds up to a thickness of approximately one-tenth of a thousandth of an inch, and thereafter is rinsed in water. FIG. 5 shows the electroless-plated layer 16 of copper that covers all portions of the board except where the resist 13 is located. It should particularly be noted that the electroless-plated layer 16 of copper covers the surface of the board 11 in all of the holes 12.

Figure 6:
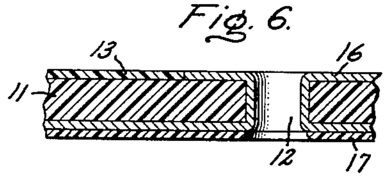

The next step is to place a layer of resist on the back surface of the board 11, the result being as shown in FIG. 6 wherein the layer of resist is indicated by the numeral 17. This resist may be applied by using a roller-coating technique, and the resist material should be of a kind that will withstand a copper electroplating bath. Suitable well known resist materials are, as mentioned above, polyester resins, epoxy resins, melamine plastic, certain silicone resins, and also certain lacquers.

Next, the board is electroplated. A suitable electroplating bath comprises a solution of:

28 ounces of copper sulphate,
7 ounces of sulfuric acid, and
Water to form 1 gallon of solution.

Figure 7:
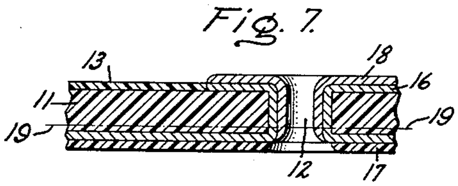

The board is placed in the electro-plating bath, and in order to provide the required electroplating current, one terminal of a current source is connected to an electrode that is placed in the electroplating bath, and the other terminal of the current source is connected to, or pressed against, relatively small portions of one or more of the electroless-plated areas 15. Thus, a current-conductive path is established, from the electroless-plated areas 15 to which the current electrode is connected, through the electroless plating in one or more of the holes 12 to the layer of electroless plating which covers the bottom of the board 11, and thence through the electroless-plating of other holes 12 to all of the remaining electroless-plated areas 15, whereby a layer of copper is electroplated onto the electroless-plating at each of the areas 15. If desired, special areas 15 may be provided on the front surface of the board 11 for the purpose of making the current connection for electroplating, these special areas 15 not being used thereafter for the purpose of electrical conductors on the board 11. Usually, there is a common or electrically grounded area 15, of appreciable size and extending over a considerable portion of the board 11, to which the current connection can be made conveniently. Preferably, the board is electroplated for approximately one and one-half hours or until the electroplated copper has built up to a thickness of approximately two thousandths of an inch as measured by the Kocour method of thickness measurement. The electroplated copper will cover the electroless-plated copper 16 at all of the areas 15 and the walls of the holes 12, as indicated by the numeral 18 in FIG. 7. After the electroplating, the board preferably is rinsed in water which contains a detergent, in order to "passivate" the electroplated material.

Figure 8:
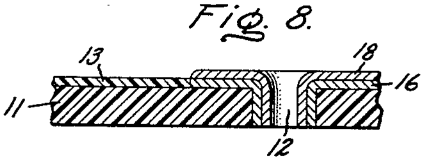

After the electroplating step, the resist 17 and the layer of electroless plating 16 at the back surface of the board 11 are removed. This may be accomplished by sand blasting, or by grinding the bottom surface to an extent indicated by the line 19 in FIG. 7. The result as shown in FIG. 8, is a plated circuit board of electrically insulating material 11 having electrical conductors 15 thereon composed of a layer 16 of electroless-plated material covered by a layer 18 of electroplated material, these layers of plated conductive material extending into the holes 12. The resist material 13 remains on the final product.

Figure 9:
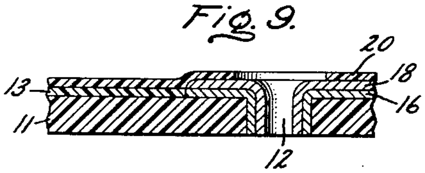
FIG. 9 is a cross-sectional view taken on line 9—9 of FIG. 2.
Figure 1:
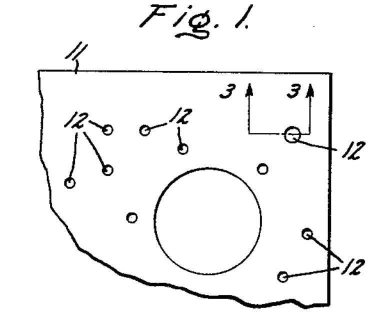
FIG. 1 is a front view of a portion of a board on which a circuit is to be plated.

The final step is to apply a layer 20 of solder resist to the entire upper surface of the plated circuit board, except in the immediate vicinities of the holes 12, as shown in FIG. 9. The solder resist may comprise a well known epoxy or polyester resin, or other resinous or plastic materials, that will withstand the temperatures used in soldering. The solder resist 20 may be applied by a silk screen process, and it functions to confine solder, when subsequently employed, to the plated holes 12 and their immediate vicinity. The solder resist 20 also functions to protect the plated conductors 15. Also the solder resist 20 helps to hold the plated conductors onto the board 11.

Although the foregoing description of a preferred method of making a plated circuit board in accordance with the invention has included considerable detail in order to fully disclose the method so that a person skilled in the art can easily practice the invention, it is to be understood that, if desired, certain of the detailed steps may be omitted or altered, and the chemical solutions and materials which have been described are given by way of example, and other suitable solutions and materials may be used in lieu thereof. The basic steps of the invention are to provide one or more holes through a board or base of electrically insulating material at each area where a plated conductor is desired, then apply a resist to one side of the board at all areas except where the plated circuitry is desired in the final product, then electro-less plate the board with conductive material wherever the board is not covered by the resist, apply a resist to the backside of the board, electroplate the exposed portions of the electroless-plated material, making use of the electroless-plated holes to provide a current path for accomplishing the electroplating, and thereafter removing the resist and electroless-plated material from the backside of the board.

It will be apparent that the method of this invention provides accurately reproducible plated circuit boards, and does not require the removal of any material from the circuit side of the board, thereby avoiding the risk of contamination of, or injury to, the plated circuit.

The plated circuit board may be used advantageously as follows. Electrical components are positioned on the non-circuit side of the board, with their leads extending through the proper holes in the board. The board, circuit side down, is lowered onto the surface of molten solder and then removed; the solder rises into the holes and electrically and mechanically secures the leads to the plated conductors. During the soldering, the board 11 acts as a heat insulator for protecting the electrical components from the heat of the solder. An alternate method of attaching components, is to place the electrical components on the circuit side of the board, with their leads extending through the proper holes. Then the board is lowered, non-circuit side down, against the surface of molten solder and then removed. As described before, the solder rises into the holes and electrically and mechanically secures the leads to the plated conductors. During soldering, the board 11 acts as a heat insulator for protecting the electrical components, and also the plated conductors, from the heat of the solder.

While a preferred embodiment of the invention has been described, various other embodiments and modifications thereof will be apparent to those skilled in the art, but will be within the scope of invention as defined in the following claims.

What is claimed is:

1. A method of making a plated circuit board, comprising the steps of providing a board of electrically insulating material devoid of metal laminations on the surfaces thereof, providing at least one hole through said board at each area thereof where a plated conductor is desired, applying a resist to the front surface of the board at all areas except where plated conductors are desired, electroless-plating conductive material onto the walls of said holes and onto both surfaces of the board except where covered by said resist, applying a resist over the electroless-plated material on the back surface only of said board, electroplating conductive material onto the exposed electroless-plated areas by making a current connection through the electroless plating on the back surface of the board, and removing the resist and the electroless-plated material from the back surface of said board to sever electrical connections that were used for the step of electroplating.

2. A method of making a plated circuit board comprising the steps of providing a board of electrically insulating material devoid of metal laminations on the surfaces thereof, providing at least hole through said board at each area thereof where a plated conductor is desired, applying a resist to the front surface of the board at all areas except where plated conductors are desired, electroless-plating conductive material onto the walls of said holes and onto both surfaces of the board except where covered by said resist, applying a resist over the electroless-plated material on the back surface only of said board, electroplating conductive material onto the exposed electroless-plated areas by providing a current connection to the electroless-plated material on the back surface of the board, whereby current flows through the electroless-plated material in the holes to the electroless-plated areas on the front surface of the board, and removing the resist and the electroless-plated material from the back surface of the board to sever electrical connections that were used for the step of electroplating.

3. A method of making a plated circuit board, comprising the steps of providing a board of electrically insulating material devoid of metal laminations on the surfaces thereof, providing at least one hole through said board at each area thereof where a plated conductor is desired, seeding said board with metallic ions, applying a resist to the front surface of the board at all areas except where the plated conductors are desired, electroless-plating conductive material onto the walls of said holes and onto both surfaces of the board except where covered by said resist, applying a resist over the electroless-plated material on the back surface only of said board, electroplating conductive material onto the exposed electroless-plated areas by making a current connection to one or more areas of electroless-plated material on the front surface of the board whereby current flows through electroless-plated material in one or more of the holes to the electroless-plated material on the back side of the board, and thence through the electroless-plated material in other holes to the electroless-plated areas on the front surface of the board, removing the resist and electroless-plated material from the back surface of the board to sever electrical connections that were used for the step of electroplating, and applying a solder resist over the electroplated material and first-named resist on the front surface of said board except in the immediate vicinity of the holes.

4. A method of making a plated circuit board, comprising the steps of providing a board of electrically insulating material devoid of metal laminations on the surfaces thereof, providing at least one hole through said board at each area thereof where a plated conductor is desired, applying electrically conductive material onto the front surface of the board only over the areas where plated conductors are desired, applying electrically conductive material to the board from front to back thereof through said hole at each of said areas where a plated conductor is desired, applying electrically conductive material onto at least a portion of the back surface of the board to electrically interconnect said electrically conductive material in the holes whereby each of the electrically conductive areas on the front surface of the board is electrically connected to the conductive material on the back surface of the board, applying a resist over said electrically conductive material on the back surface only of said board, electro-plating conductive material onto the aforesaid conductive material at least on said areas thereof on the front of the board by making a current connection through the conductive material that is on the back surface of the board, and thereafter removing at least a portion of the conductive material from the back of the board to sever electrical connections that were used for the steps of electroplating.

5. A method of making a plated circuit board, comprising the steps of providing a board of electrically insulating material devoid of metal laminations on at least the front surface thereof, providing at least one hole through said board at each of a plurality of isolated areas on the front surface thereof where electrically isolated plated conductors are desired, applying electrically conductive material onto the front surface of the board only over the plurality of isolated areas where plated conductors are desired, applying electrically conductive material to the board from front to back thereof through said hole at each of said plurality of isolated areas where a plated conductor is desired, applying electrically conductive material onto at least a portion of the back surface of the board to electrically interconnect said electrically conductive material in the holes whereby each of the isolated electrically conductive areas on the front surface of the board is electrically connected to the conductive material on the back surface of the board to provide temporary current connections to said isolated electrically conductive areas solely for the subsequent step of electroplating, electroplating conductive material onto the aforesaid conductive material at least on said isolated areas thereof on the front of the board by making a current connection through the conductive material that is on the back surface of the board, and thereafter removing at least a portion of the conductive material from the back of the board to sever each of the temporary electrical connections that were used for the step of electroplating.

6. In a method of making electrically isolated plated circuit conductors on the front surface of an electrically insulating board devoid of a metal lamination on the front surface thereof, wherein selected isolated areas of the front surface are electroless plated followed by electroplating, the steps of providing an auxiliary conductor on the back surface of said board for use in providing temporary current connections to the isolated electroless plated areas solely for the subsequent step of electroplating, extending said auxliary conductor to the front surface of the board at multiple locations to make electrical contact with each of the isolated electroless plated areas on the front surface of the board, electroplating conductive material onto the isolated electroless plated areas on the front surface of the board by making a current connection through said auxiliary conductor, and thereafter removing at least a portion of said auxiliary conductor to sever each of the temporary electrical connections that were used for the step of electroplating.

7. A method of making a plated electrical circuit comprising the steps of providing at least one hole, extending from the front of a piece of electrically insulating material to the back, within each of a plurality of isolated areas on the front side that are to be electroplated with metal, said electrically insulating material being devoid of a metal lamination on said front side thereof, applying an electrically conducting material to the front side of the electrically insulating material only at said isolated areas, on the sides of said holes and on the back of said piece of insulating material, the electrically conducting material on the back of said piece of insulating material being such as to make electrical connections to the conducting material on the sides of the holes to provide temporary current conections to said conducting material at said isolated areas solely for the subsequent step of electroplating, making electrical connection to the electrically conducting material and utilizing said electrical connections to electroplate metal onto the said electrically conducting material at said isolated areas, and thereafter removing portions of the said conducting material from the back side of said piece of insulating material to sever each of the temporary connections that were used for the step of electroplating.

8. A method of making a plated circuit board having a plurality of electrically isolated conducting areas on the front side thereof, comprising the steps of providing a board of electrically insulating material devoid of a metal lamination on at least the front side thereof, providing at least one hole through said board located within each isolated area on the front side thereof where a plated conductor is desired, applying an electrically conductive material to the front side of said board only on said areas and to the sides of said holes and on at least a portion of the back side of said board to interconnect the conductive material of said areas on the front side of the board, applying an electroplating resist over the electrically conductive material only on the back side of said board, making electrical connection to said electrically conductive material, and using said connection to electroplate metal onto the said areas on the front side of the board and onto the sides of said holes, and thereafter removing portions of said electrically conductive material from the back side of said board to sever connections that were used for the step of electroplating.

References Cited in the file of this patent

UNITED STATES PATENTS

| | | |
|---|---|---|
| 2,433,384 | McLarn | Dec. 30, 1947 |
| 2,699,425 | Nieter | Jan. 11, 1955 |
| 2,848,359 | Talmey | Aug. 19, 1958 |
| 2,872,391 | Hauser | Feb. 3, 1959 |
| 2,940,018 | Lee | June 7, 1960 |